United States Patent

Fujimura

(10) Patent No.: US 9,564,461 B2
(45) Date of Patent: Feb. 7, 2017

(54) RADIATION IMAGE-PICKUP DEVICE AND RADIATION IMAGE-PICKUP DISPLAY SYSTEM

(71) Applicant: Sony Corporation, Tokyo (JP)

(72) Inventor: Takashi Fujimura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 30 days.

(21) Appl. No.: 14/289,436

(22) Filed: May 28, 2014

(65) Prior Publication Data

US 2014/0367581 A1    Dec. 18, 2014

(30) Foreign Application Priority Data

Jun. 12, 2013   (JP) ................. 2013-123877

(51) Int. Cl.
*H01L 27/146*   (2006.01)
*G01T 1/24*     (2006.01)

(52) U.S. Cl.
CPC ........... *H01L 27/14612* (2013.01); *G01T 1/24* (2013.01); *H01L 27/1463* (2013.01); *H01L 27/14605* (2013.01); *H01L 27/14659* (2013.01)

(58) Field of Classification Search
CPC ........... H01L 27/14612; H01L 27/1463; H01L 27/14605; H01L 27/14659; G01T 1/24
See application file for complete search history.

(56) References Cited

U.S. PATENT DOCUMENTS 6,323,490 B1 *  11/2001  Ikeda ................ H01L 27/14659
                                                    250/370.07

FOREIGN PATENT DOCUMENTS

| JP | 09-503351 A | 3/1997 |
|----|-------------|--------|
| JP | 2001-320039 A | 11/2001 |
| JP | 2002-228757 A | 8/2002 |
| JP | 2004-087604 A | 3/2004 |
| JP | 2004-265935 A | 9/2004 |
| JP | 2013-089869 A | 5/2013 |

* cited by examiner

*Primary Examiner* — David Porta
*Assistant Examiner* — Shun Lee
(74) *Attorney, Agent, or Firm* — Wolf, Greenfield & Sacks, P.C.

(57) ABSTRACT

A radiation image-pickup device includes: a drive substrate including a transistor used to read, from each of a plurality of pixels, signal charge based on radiation; a charge collection electrode provided on the drive substrate, for each of the pixels; a conversion layer formed on the charge collection electrode, and configured to generate the signal charge by absorbing radiation; a counter electrode provided on the conversion layer; and a first conductive film disposed, between the drive substrate and the charge collection electrode, to face at least a part of the charge collection electrode, and included in a first capacitive element configured to retain the signal charge.

9 Claims, 13 Drawing Sheets

RADIATION IMAGE-PICKUP DEVICE AND RADIATION IMAGE-PICKUP DISPLAY SYSTEM

CROSS REFERENCE TO RELATED APPLICATIONS

This application claims the benefit of Japanese Priority Patent Application JP2013-123877 filed Jun. 12, 2013, the entire contents of which are incorporated herein by reference.

BACKGROUND

The present disclosure relates to a radiation image-pickup device obtaining an image based on radiation that has entered, and a radiation image-pickup display system including such a radiation image-pickup device.

In recent years, radiation image-pickup devices that obtain an image based on radiation such as X-rays as an electric signal have been developed (for example, Japanese Unexamined Patent Application Publication No. 2002-228757). Such radiation image-pickup devices are broadly divided into, so-called, an indirect conversion type and a direct conversion type. Of these, in the radiation image-pickup devices of the indirect conversion type, for example, a conversion layer generating electric signals by absorbing X-rays may be provided, and signal charge may be extracted from this conversion layer through a pair of electrodes.

SUMMARY

In the radiation image-pickup devices of the direct conversion type as described above, a capacitive element (a retention capacitive element) used to retain the extracted signal charge is provided for each pixel. Even if pixel definition becomes higher (resolution becomes higher) and a pixel size is reduced, suppression of image quality deterioration is expected by securing a sufficient capacity.

It is desirable to provide a radiation image-pickup device capable of suppressing image quality deterioration accompanying an increase in pixel definition, and to provide a radiation image-pickup display system including such a radiation image-pickup device.

According to an embodiment of the present disclosure, there is provided a radiation image-pickup device including: a drive substrate including a transistor used to read, from each of a plurality of pixels, signal charge based on radiation; a charge collection electrode provided on the drive substrate, for each of the pixels; a conversion layer formed on the charge collection electrode, and configured to generate the signal charge by absorbing radiation; a counter electrode provided on the conversion layer; and a first conductive film disposed, between the drive substrate and the charge collection electrode, to face at least a part of the charge collection electrode, and included in a first capacitive element configured to retain the signal charge.

According to an embodiment of the present disclosure, there is provided a radiation image-pickup display system including: a radiation image-pickup device; and a display configured to perform image display based on an image pickup signal obtained by the radiation image-pickup device, wherein the radiation image-pickup device includes a drive substrate including a transistor used to read, from each of a plurality of pixels, signal charge based on radiation, a charge collection electrode provided on the drive substrate, for each of the pixels, a conversion layer formed on the charge collection electrode, and configured to generate the signal charge by absorbing radiation, a counter electrode provided on the conversion layer, and a first conductive film disposed, between the drive substrate and the charge collection electrode, to face at least a part of the charge collection electrode, and included in a first capacitive element configured to retain the signal charge.

In the radiation image-pickup device and the radiation image-pickup display system according to the above-described embodiments of the present disclosure, between the drive substrate and the charge collection electrode, the first conductive film is disposed to face at least a part of the charge collection electrode, so that the first capacitive element configured to retain the signal charge based on the radiation is configured. Therefore, as compared with a case in which a capacitive element is formed only in a drive substrate, a degree of flexibility in layout design is high, and it is easy to secure a retention capacitor.

According to the radiation image-pickup device and the radiation image-pickup display system of the above-described embodiments of the present disclosure, between the drive substrate and the charge collection electrode, the first conductive film is disposed to face at least a part of the charge collection electrode, so that the first capacitive element configured to retain the signal charge based on the radiation is configured. Therefore, a degree of flexibility in layout design is high, and it is easy to secure a retention capacitor. Hence, even if a pixel size becomes small, a reduction in a saturated charge amount (a dynamic range) is allowed to be suppressed, by securing a desirable capacity. Accordingly, image quality deterioration accompanying an increase in pixel definition is allowed to be suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment will be described below with reference to the drawings. It is to be noted the description will be provided in the following order.
1. Embodiment (an example of a radiation image-pickup device in which a capacitive element is formed by providing a conductive film facing the entire region of a charge collection electrode)
2. Modification 1 (an example in which a conductive film is provided to face a part of a charge collection electrode)
3. Application example (an example of a radiation image-pickup display system)

Embodiment

[Configuration]

Figure 1:
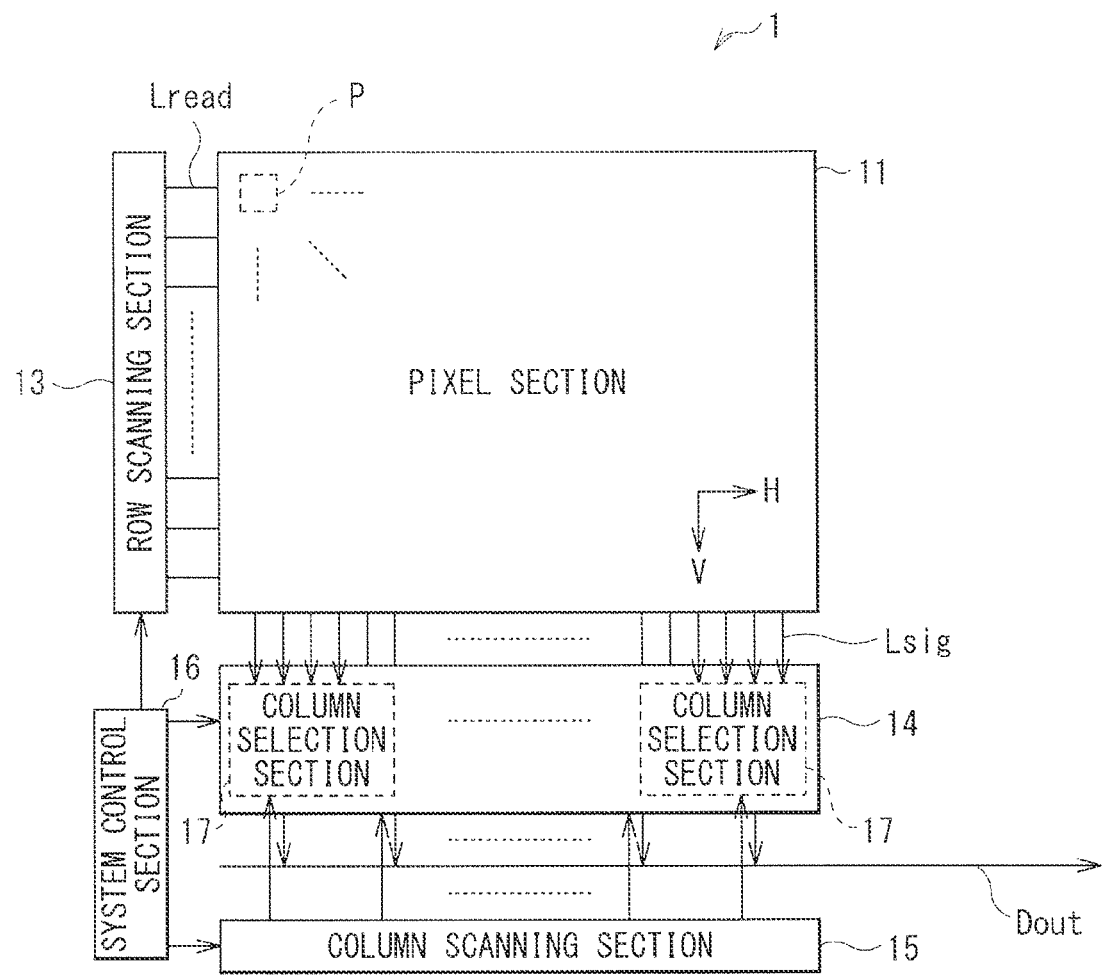
FIG. 1 is a block diagram illustrating an overall configuration example of a radiation image-pickup device according to an embodiment of the present disclosure.

FIG. 1 illustrates an overall block configuration of a radiation image-pickup device (a radiation image-pickup device 1) according to an embodiment of the present disclosure. The radiation image-pickup device 1 reads information of a subject (picks up an image of a subject) based on entering radiation (such as alpha rays, beta rays, gamma rays, and X-rays), and may be, for example, a direct-conversion-type flat panel detector (FPD). The radiation image-pickup device 1 includes a pixel section 11. The radiation image-pickup device 1 further includes, as drive circuits of the pixel section 11, a row scanning section 13, an A/D conversion section 14, a column scanning section 15, and a system control section 16.

(Pixel Section 11)

Figure 2:
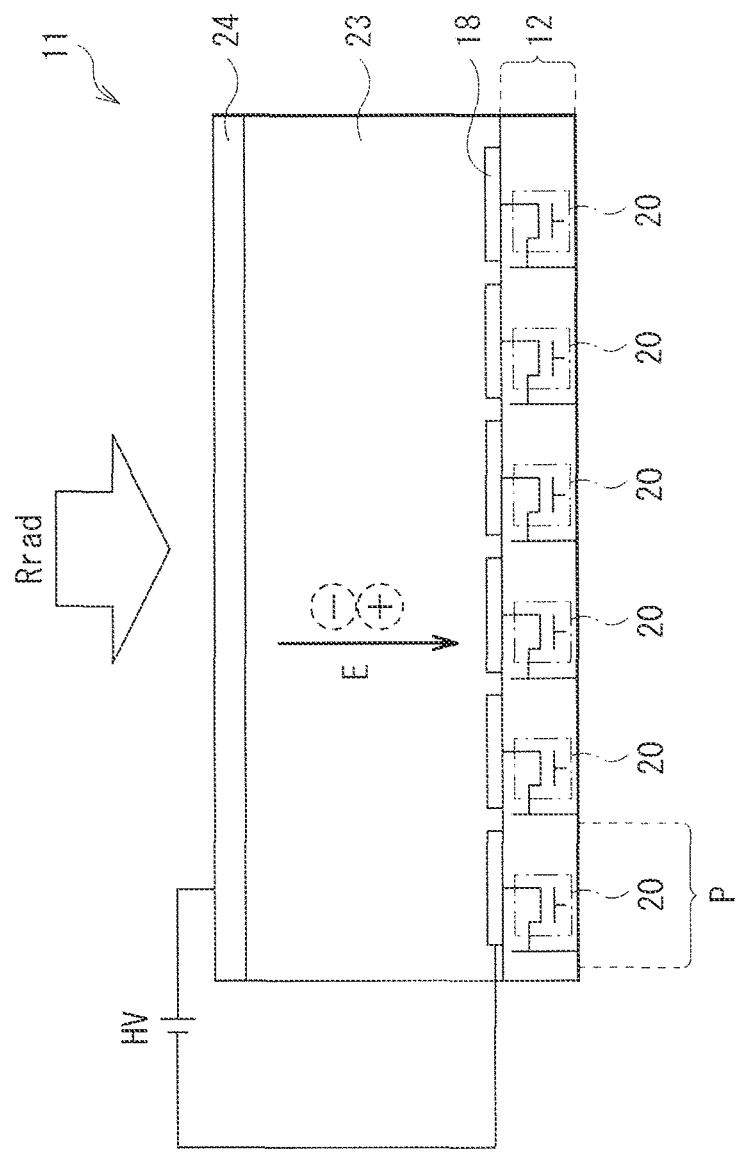
FIG. 2 is a schematic diagram illustrating a configuration of a pixel section illustrated in FIG. 1.

The pixel section 11 includes a plurality of pixels (image pickup pixels, or unit pixels) P generating signal charge based radiation. The pixels P are two-dimensionally arranged in rows and columns (in a matrix). It is to be noted that, in the following, a horizontal direction (a row direction) in the pixel section 11 will be referred to as an "H" direction, and a vertical direction (a column direction) will be referred to as a "V" direction, as illustrated in FIG. 1. FIG. 2 schematically illustrates a cross-sectional configuration of the pixel section 11.

In the pixel section 11, radiation Rrad is absorbed by a direct conversion layer (a direct conversion layer 23) so that an electric signal (a positive hole and an electron) is generated, and this electric signal is read out as signal charge. As will be described later in detail, in the pixel section 11, a charge collection electrode 18 is provided on a drive substrate 12, for each of the pixels P. The drive substrate 12 includes a pixel circuit 20 used to read a signal. A counter electrode 24 is provided to face the charge collection electrode 18, with the direct conversion layer 23 interposed therebetween. The direct conversion layer 23 as described above may be configured using, for example, a material such as an amorphous selenium (a-Se) semiconductor and a cadmium tellurium (CdTe) semiconductor. A bias voltage, for example, may be applied to the counter electrode 24.

Figure 3:
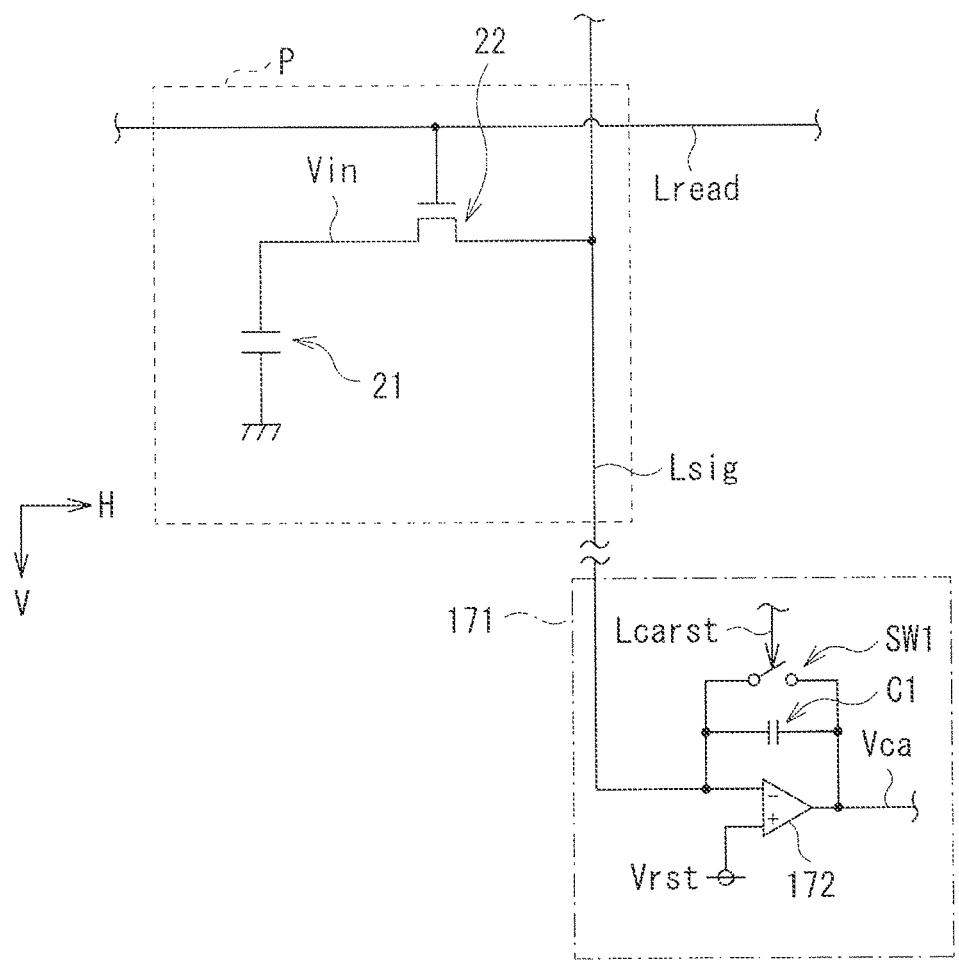
FIG. 3 is a circuit diagram illustrating a configuration of components including a pixel illustrated in FIG. 1.

FIG. 3 illustrates an example of a circuit configuration (a so-called passive circuit configuration) of the pixel P, together with a circuit configuration of a charge amplifier circuit 171 to be described later provided in the A/D conversion section 14. The passive pixel P may include, for example, one capacitive element 21 and one thin film transistor (TFT) 22. Further, a readout control line Lread (a scanning line, or a gate line) extending in the H direction and a signal line Lsig extending in the V direction are connected to the pixel P.

The capacitive element 21 retains the signal charge generated in the direct conversion layer 23. Here, the capacitive element 21 includes capacitive elements 21A to 21C to be described later (has a synthetic capacity of each capacity of the capacitive elements 21A to 21C). However, the capacitive element 21 does not necessarily include all of the capacitive elements 21A to 21C, and may include at least the capacitive element 21A.

The TFT 22 is a switching element that outputs the signal charge obtained by the direct conversion layer 23 to the signal line Lsig, by changing to an ON state in response to a row scanning signal supplied from the readout control line Lread. The TFT 22 may be configured using, for example, an N-channel-type (N-type) field effect transistor (FET). However, the TFT 22 may be configured using other type such as a P-channel-type (P-type) FET.

The TFT 22 may have, for example, a bottom-gate-type or a top-gate-type element structure. Alternatively, the TFT 22 may have a so-called dual-gate-type (both-side-type) element structure in which two gate electrodes are disposed to face each other with a semiconductor layer (an active layer) interposed therebetween. In the present embodiment, a case in which the dual-gate-type is adopted is described as an example.

[Detailed Configuration of Capacitive Element 21]

Figure 4:
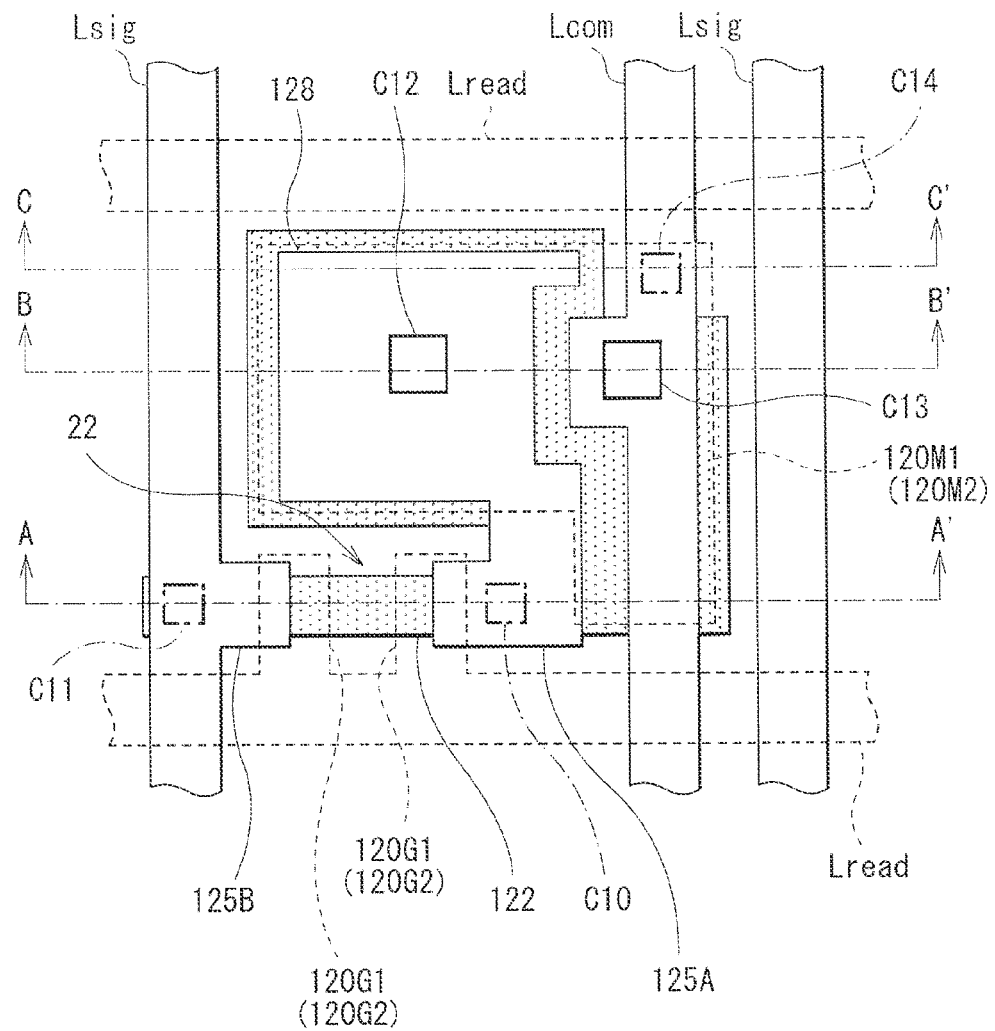
FIG. 4 is a plan view illustrating a main part configuration of a part in the vicinity of the pixel illustrated in FIG. 1.
Figure 5:
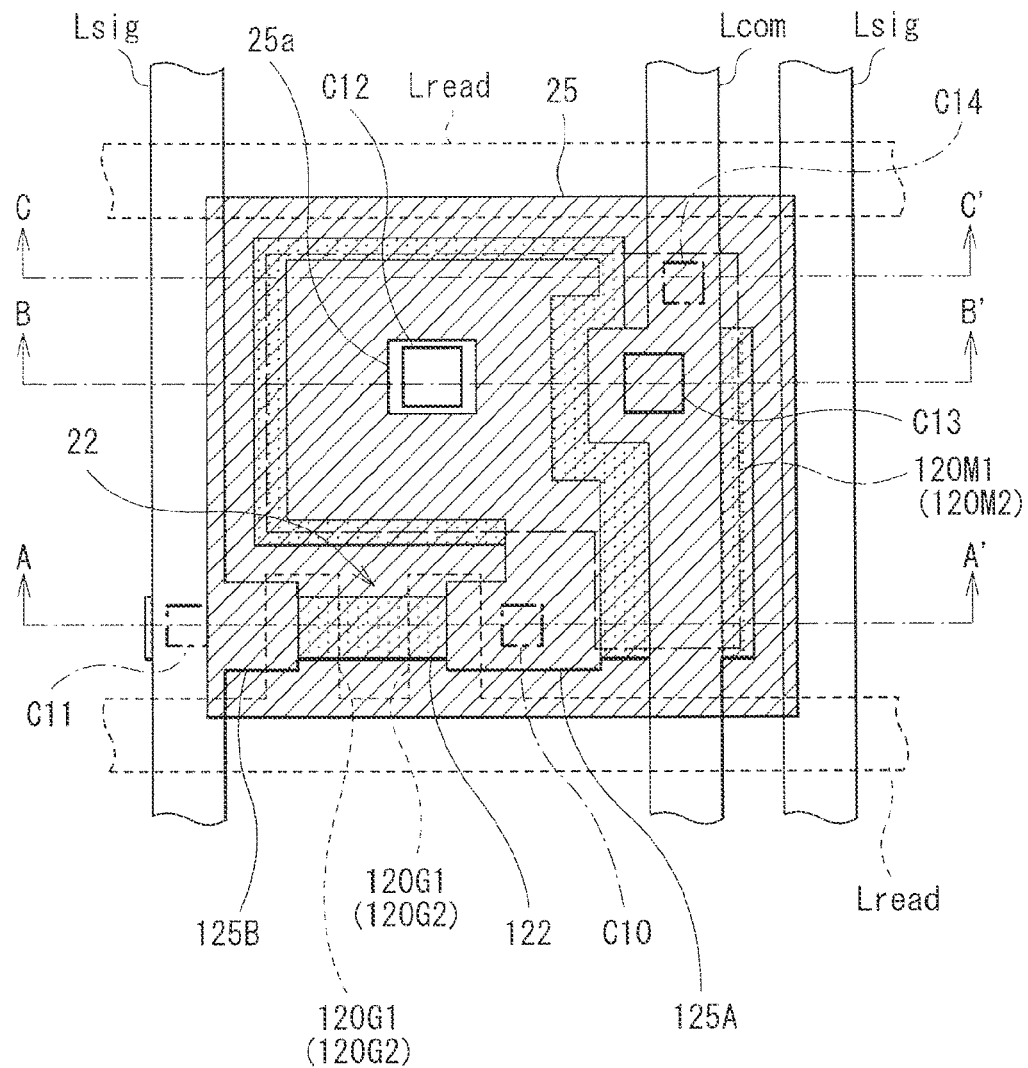
FIG. 5 is another plan view illustrating the main part configuration of the part in the vicinity of the pixel illustrated in FIG. 1.
Figure 6:
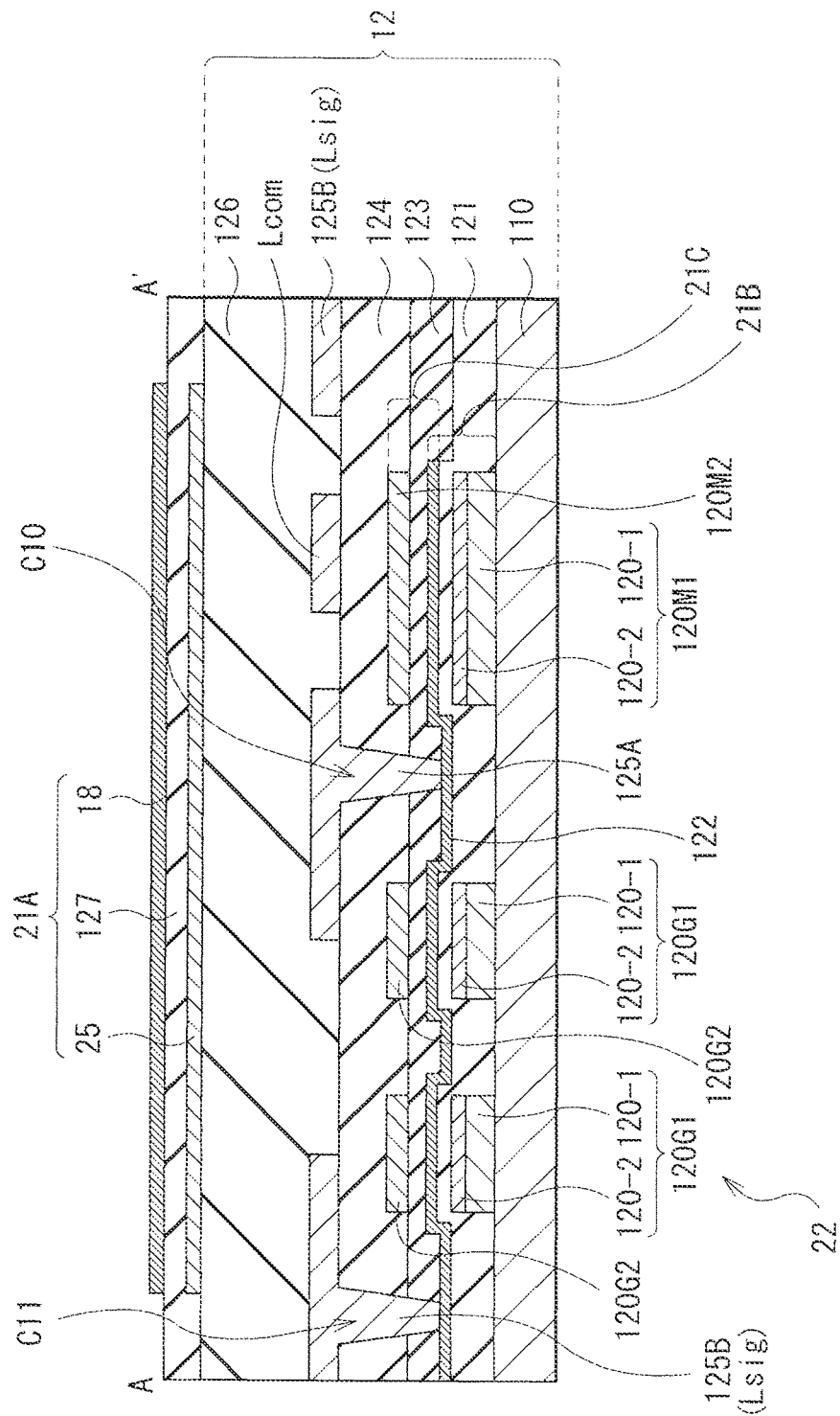
FIG. 6 is a cross-sectional diagram taken along a line A-A' of the part in the vicinity of the pixel illustrated in FIGS. 4 and 5.
Figure 7:
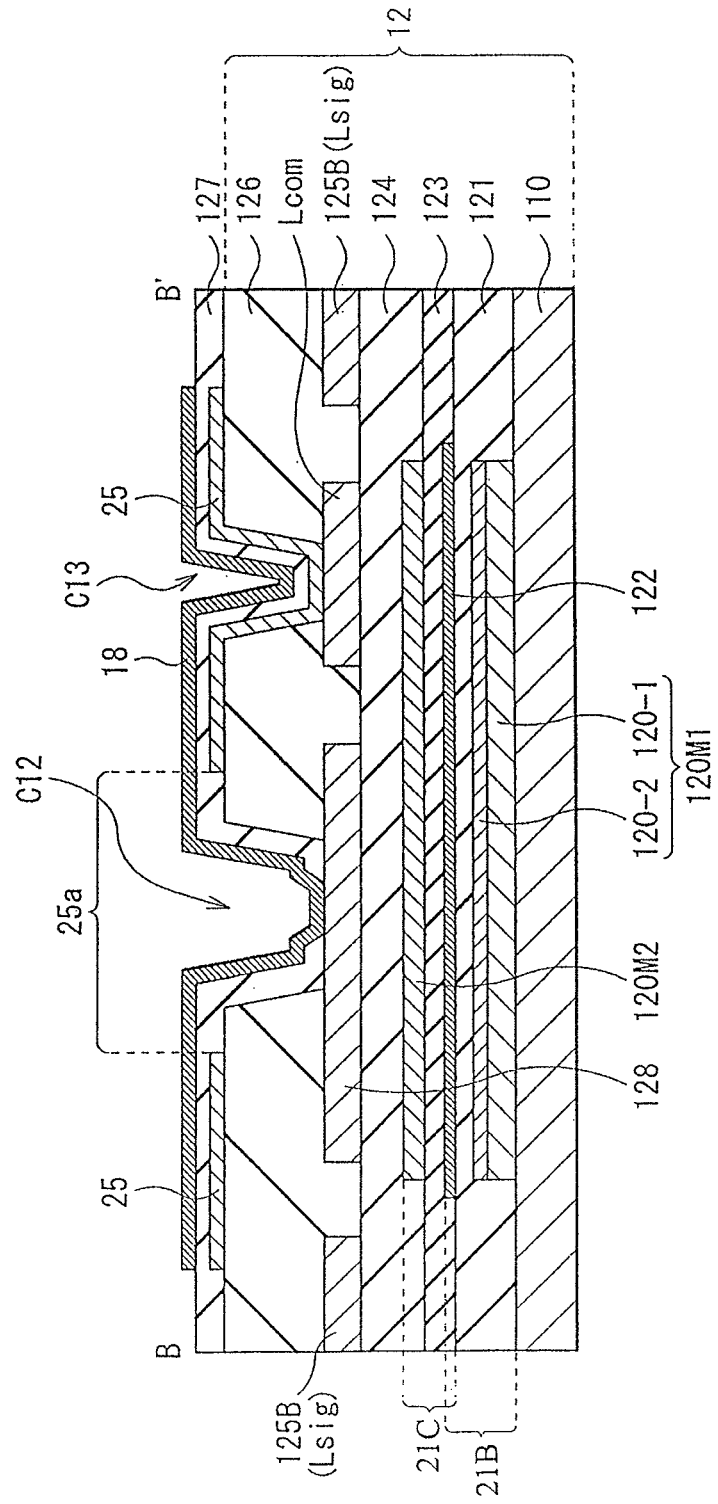
FIG. 7 is a cross-sectional diagram taken along a lien B-B' of the part in the vicinity of the pixel illustrated in FIGS. 4 and 5.
Figure 8:
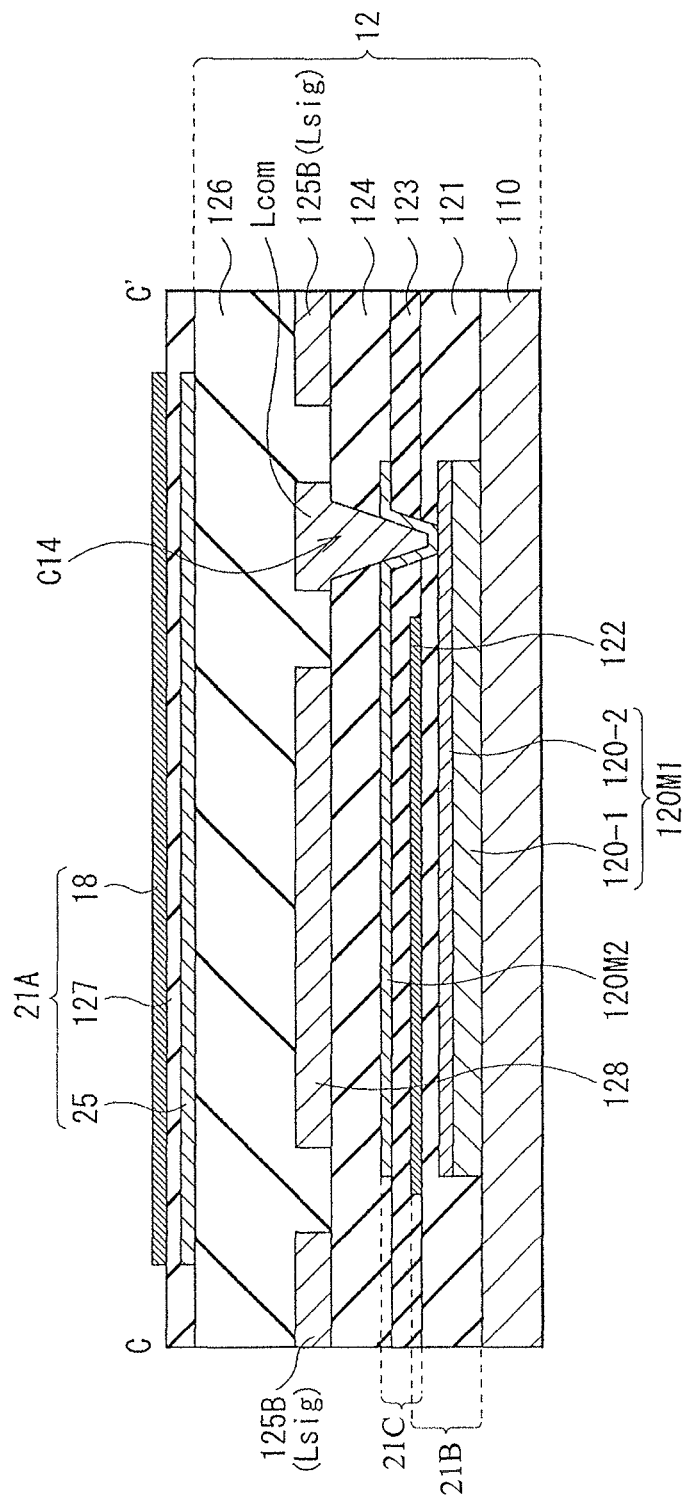
FIG. 8 is a cross-sectional diagram taken along a lien C-C' of the part in the vicinity of the pixel illustrated in FIGS. 4 and 5.

In the present embodiment, the capacitive elements 21A to 21C, which are included in the capacitive element 21 and provided for each of the pixels P, are formed in the drive substrate 12 or on the drive substrate 12. A layout configuration of the capacitive elements 21A to 21C will be described with reference to FIGS. 4 to 8. FIG. 4 is a plan view illustrating a main part configuration (a configuration of various electrodes and wirings formed in the drive substrate 12) of a part in the vicinity of the pixel P. FIG. 5 is a diagram in which a conductive film (a conductive film 25 forming a part of the capacitive element 21A) on the drive substrate 12 is added to the configuration of FIG. 4. Further, FIG. 6 illustrates a cross-sectional configuration taken along a line A-A' in FIGS. 4 and 5. FIG. 7 illustrates a cross-sectional configuration taken along a line B-B' in FIGS. 4 and 5. FIG. 8 illustrates a cross-sectional configuration taken along a line C-C' in FIGS. 4 and 5.

As illustrated in FIGS. 6 to 8, the drive substrate 12 is a substrate in which the TFT 22, the signal line Lsig, a common ground line Lcom, and the readout control line Lread (not illustrated in FIGS. 6 to 8) are formed to be a multilayer on a substrate 110 configured of a material such glass. A surface of the drive substrate 12 is flattened by a flattening film 126. Specifically, for example, two dual-gate-type TFTs may each be disposed on the substrate 110, as the TFT 22. In each of these TFTs, a first gate electrode 120G1, a first gate insulating film 121, a semiconductor layer 122, a second gate insulating film 123, and a second gate electrode 120G2 may be laminated in this order from the substrate 110 side. Of these, the first gate insulating film 121 and the second gate insulating film 123 are layers common to the TFTs, and may be configured using, for example, a silicon nitride film, a silicon oxide film, or the like.

On the second gate electrode 120G2 of the TFT 22, an interlayer insulating film 124 is formed. On the interlayer insulating film 124, a drain electrode 125B, a source electrode 125A, and the common ground line Lcom are provided. The drain electrode 125B is electrically connected to the signal line Lsig. The source electrode 125A is electrically connected to each of the capacitive elements 21A to 21C. To cover these components, the flattening film 126 is formed on the surface of the drive substrate 12. The flattening film 126 may be configured of, for example, an organic material or the like, and may have, for example, a thickness of about 0.5 μm to about 5 μm.

(Capacitive Element 21A)

On the drive substrate 12 (specifically, on the flattening film 126), the charge collection electrode 18 is formed for each of the pixels P, as described above. In the present embodiment, between the charge collection electrode 18 and the drive substrate 12, the conductive film 25 (a first conductive film) is provided to face at least a part of the charge collection electrode 18, so that the capacitive element 21A is formed. Between the charge collection electrode 18 and the conductive film 25, an insulating film 127 is interposed. The charge collection electrode 18, the insulating film 127, and the conductive film 25 are included in the capacitive element 21A. The insulating film 127 also serves as a passivation film, and a thickness thereof may be freely set from the viewpoint of a retention capacitor, a passivation function, etc. that are necessary in the capacitive element 21A.

(Capacitive Elements 21B and 21C)

In the drive substrate 12, the capacitive elements 21B and 21C may be formed, for example, in the same layer as the TFT 22 (FIG. 6). The capacitive element 21B may include, for example, a conductive film 120M1 (a second conductive film), a first gate insulating film 121, and the semiconductor layer 122. The conductive film 120M1 is formed in the same layer as the first gate electrode 120G1. The capacitive element 21C may include, for example, a conductive film 120M2 (a third conductive film), a second gate insulating film 123, and the semiconductor layer 122. The conductive film 120M2 may be formed, for example, in the same layer as the second gate electrode 120G2. The first gate insulating film 121, the second gate insulating film 123, and the semiconductor layer 122 are formed (integrally) to extend from a formation region of the TFT 22 to formation regions of the capacitive elements 21B and 21C. The conductive film 120M1 is a film in which electrode layers 120-1 and 120-2 are formed using the same material as that of the first gate electrode 120G1, and being patterned in the same process. The conductive film 120M2 is a film formed using the same material as that of the second gate electrode 120G2, and being patterned in the same process.

The capacitive elements 21B and 21C (i.e., the conductive films 120M1 and 120M2) are formed in regions not facing (not overlapping) each of the TFT 22, the signal line Lsig, and the readout control line Lread (FIGS. 4 and 6). Each of the TFT 22 and the capacitive elements 21A to 21C, as well as a connection relationship therebetween will be described below.

The first gate electrode 120G1 may be, for example, an electrode in which the two electrode layers 120-1 and 120-2 are laminated. The electrode layers 120-1 and 120-2 may each be configured using, for example, any of elements such as molybdenum (Mo), titanium (Ti), aluminum (Al), tungsten (W), and chromium (Cr). The second gate electrode 120G2 is formed to face the first gate electrode 120G1 and to have substantially the same shape as that of the first gate electrode 120G1. Further, a material equivalent to the material of the electrode layers 120-1 and 120-2 may be used as a material of the second gate electrode 120G2. The first gate electrode 120G1 and the second gate electrode 120G2 may be, for example, at the same electric potential, and may be electrically connected to the readout control line Lread (FIG. 4).

The semiconductor layer 122 may be configured using, for example, a silicon system semiconductor such as amorphous silicon, micro-crystal silicon, and poly-silicon, and preferably, low temperature poly-silicon (LTPS) may be used. However, without being limited to these materials, the semiconductor layer 122 may be configured using an oxide semiconductor such as zinc oxide (ZnO) and indium gallium zinc oxide (InGaZnO). In the present embodiment, a case in which the semiconductor layer 122 is configured using poly-silicon will be described as an example.

The source electrode 125A may be, for example, a single layer film configured of any of elements including molybdenum, titanium, aluminum, tungsten, chromium, and the like, or a laminated film including two or more of these elements. The source electrode 125A is connected to the semiconductor layer 122 through a contact section C10 (FIGS. 4 and 6), and electrically connected to (here, formed (as the same layer) integrally with) a wiring (a Cs wiring 128) for a retention capacitor.

The Cs wiring 128 is electrically connected to the charge collection electrode 18 of the capacitive element 21A, through a contact section C12 (FIGS. 4 and 7). The Cs wiring 128 may be formed in a predetermined region (for example, a region not facing the TFT 22, the signal line Lsig, the readout control line Lread, and the common ground line Lcom).

The drain electrode 125B may be, for example, a single layer film configured of any of elements including molybdenum, titanium, aluminum, tungsten, chromium, and the like, or a laminated film including two or more of these elements. The drain electrode 125B is connected to a contact section C11, through the semiconductor layer 122 (FIGS. 4 and 6).

The charge collection electrode 18 may be configured using, for example, metal such as aluminum (Al) or a transparent conductive film such as indium tin oxide (ITO). A planar shape of the charge collection electrode 18 is not limited in particular. However, the charge collection electrode 18 may be preferably formed to cover the entire region of a pixel opening (a square or rectangular region surrounded by the signal line Lsig and the readout control line Lread), in order to increase sensitivity and a fill factor as much as possible. The charge collection electrode 18 may have a thickness of, for example, about 50 nm to about 200 nm. The charge collection electrode 18 is connected to the Cs wiring 128, through the contact section C12, as described above (FIGS. 4 and 7).

The conductive film 25 may be configured using, for example, metal such as aluminum or a transparent conductive film such as indium tin oxide (ITO). The material of the conductive film 25 is not limited in particular. However, the conductive film 25 may be preferably configured using a transparent conductive film, to allow removal of residual charge of the direct conversion layer 23 by irradiation with visible light from the substrate 110 side. The conductive film 25 may have a thickness of, for example, about 50 nm to about 200 nm. In the present embodiment, the conductive film 25 is formed to face the entire region of the charge collection electrode 18 (to have the same shape and size as those of the charge collection electrode 18) (FIGS. 5 to 8). However, a part corresponding to the contact section C12 is selectively removed to form a contact opening 25a (FIGS. 4 and 7). The conductive film 25 as described above is electrically connected to the common ground line Lcom, through a contact section C13 (FIGS. 4 and 7).

The conductive film 120M1 is configured of the same material and has the same thickness as those of the first gate electrode 120G1, and is electrically connected to the common ground line Lcom, through a contact section C14 (FIGS. 4 and 8). The conductive film 120M2 is configured of the same material and has the same thickness as those of the second gate electrode 120G2, and is electrically connected to the common ground line Lcom, through the contact section C14 (FIGS. 4 and 8).

As described above, one (the conductive film 25, as well as the conductive films 120M1 and 120M2) of the pair of conductive films included in each of the capacitive elements 21A to 21C is connected to the common ground line Lcom. The other (the charge collection electrode 18, and the semiconductor layer 122) of the conductive films is electrically connected to the source electrode 125A. Therefore, the signal charge retained by each of the capacitive elements 21A to 21C is read out to the signal line Lsig through the TFT 22 at predetermined timing.

(Row Scanning Section 13)

The row scanning section 13 includes a shift register circuit to be described later, a predetermined logical circuit, etc. The row scanning section 13 is a pixel driving section (a row scanning circuit) that performs driving (line-sequential scanning) of the plurality of pixels P of the pixel section 11 row by row (by a horizontal line unit). Specifically, the row scanning section 13 may perform image pickup operation such as reading operation and reset operation of each of the pixels P by, for example, line-sequential scanning. It is to be noted that, this line-sequential scanning is performed by supplying the above-described row scanning signal to each of the pixels P through the readout control line Lread.

(A/D Conversion Section 14)

The A/D conversion section 14 includes a plurality of column selection sections 17 each provided for a plurality of the (here, four) signal lines Lsig. The A/D conversion section 14 performs A/D conversion (analog-to-digital conversion) based on a signal voltage (a voltage corresponding to the signal charge) inputted through the signal line Lsig. As a result, output data Dout (an image pickup signal) that is a digital signal is generated and outputted to outside.

As shown in FIG. 3, each of the column selection sections 17 may include a charge amplifier 172, a capacitive element (a capacitor, a feedback capacitor, or the like) C1, a first switch SW1, a sample hold (S/H) circuit (not shown), a multiplexor circuit (a selection circuit) including four second switches (not shown), and an A/D converter (not shown). Of these components, the charge amplifier 172, the capacitive element C1, the first switch SW1, the S/H circuit, and the second switch correspond to the charge amplifier circuit 171 illustrated in FIG. 3, and are provided for each of the signal lines Lsig. The multiplexor circuit and the A/D converter are provided for each of the column selection sections 17.

The charge amplifier 172 is an amplifier provided to perform conversion (Q-V conversion) in which the signal charge read out from the signal line Lsig is converted to a voltage. In the charge amplifier 172, one end of the signal line Lsig is connected to an input terminal on a negative side (− side), and a predetermined reset voltage Vrst is inputted to an input terminal on a positive side (+ side). Between an output terminal and the input terminal on the negative side of the charge amplifier 172, feedback connection is established through a parallel connection circuit between the capacitive element C1 and the first switch SW1. In other words, one terminal of the capacitive element C1 is connected to the input terminal on the negative side of the charge amplifier 172, and the other terminal is connected to the output terminal of the charge amplifier 172. Similarly, one terminal of the first switch SW1 is connected to the input terminal on the negative side of the charge amplifier 172, and the other terminal is connected to the output terminal of the charge amplifier 172. It is to be noted that an ON/OFF state of the first switch SW1 is controlled by a control signal (an amplifier reset control signal) supplied from the system control section 16 through an amplifier reset control line Lcarst.

The S/H circuit is disposed between the charge amplifier 172 and the multiplexor circuit (the second switch), and is a circuit provided to hold an output voltage Vca from the charge amplifier 172 temporarily.

The multiplexor circuit is a circuit that selectively makes or breaks connection between each of the S/H circuits and the A/D converter, when one of the four second switches is sequentially brought to an ON state according to scanning driving by the column scanning section 15.

The A/D converter is a circuit that performs A/D conversion of the output voltage inputted from the S/H circuit through the second switch, thereby generating the above-described output data Dout, and outputs the generated output data Dout.

(Column Scanning Section 15)

The column scanning section 15 may include, for example, a shift register, an address decoder, etc. not illustrated, and sequentially drives each of the above-described second switches in the column selection section 17 while scanning each of the second switches. By such selective scanning performed by the column scanning section 15, the signal (the above-described output data Dout) of each of the pixels P read out through each of the signal lines Lsig is sequentially outputted to the outside.

(System Control Section 16)

The system control section 16 controls each operation of the row scanning section 13, the A/D conversion section 14, and the column scanning section 15. Specifically, the system control section 16 includes a timing generator that generates the above-described various timing signals (control signals). Based on these various timing signals generated by the timing generator, the system control section 16 performs control of driving the row scanning section 13, the A/D conversion section 14, and the column scanning section 15. Based on this control of the system control section 16, each of the row scanning section 13, the A/D conversion section 14, and the column scanning section 15 performs image-pickup driving (line-sequential image-pickup driving) for the plurality of pixels P in the pixel section 11, so that the output data Dout is obtained from the pixel section 11.

[Functions and Effects]

In the radiation image-pickup device 1 of the present embodiment, for example, when the radiation Rrad such as X-rays enters the pixel section 11, the radiation Rrad may be absorbed in the direct conversion layer 23, so that a pair of an electron and a hole may be generated, as illustrated in FIG. 2. At this moment, a predetermined voltage (a tube voltage of a few kilovolts (HV)) is applied to the direct conversion layer 23, through the charge collection electrode 18 and the counter electrode 24. As a result, electric charge (a positive hole or an electron) generated in the direct conversion layer 23 is extracted as signal charge through the charge collection electrode 18 for each of the pixels P, and then retained at the capacitive element 21 (the capacitive elements 21A to 21C). Subsequently, when the TFT 22 changes to the ON state in response to the row scanning signal supplied through the readout control line Lread, the above-described signal charge is read out to the signal line Lsig.

The signal charge thus read out is inputted to the column selection section 17 in the A/D conversion section 14, for each plurality of (here, four) pixel columns, through the signal line Lsig. In the column selection section 17, at first, the Q-V conversion (conversion from signal charge to a signal voltage) is performed in the charge amplifier circuit including the charge amplifier 172 and the like, for each signal charge inputted through each of the signal lines Lsig. Next, for each of the signal voltages after the Q-V conversion (an output voltage Vca from the charge amplifier 172), the A/D conversion is performed in the A/D converter through the S/H circuit and the multiplexor circuit. Then, the output data Dout (the image pickup signal) that is a digital signal is generated. In this way, the output data Dout is sequentially outputted from each of the column selection sections 17, and then transmitted to the outside (or inputted to an internal memory not illustrated).

Here, in the present embodiment, the conductive film 25 is provided between the drive substrate 12 and the charge collection electrode 18, and the capacitive element 21A retaining the above-described signal charge is configured using the conductive film 25 and the charge collection electrode 18. In this way, in the capacitive element 21A formed on the drive substrate 12, a degree of flexibility in layout design is high and it is easy to secure a retention capacitor, as compared with the capacitive elements 21B and 21C formed in the drive substrate 12.

For example, when a capacitive element is formed only in the drive substrate 12 as with the capacitive elements 21B and 21C, the areas and shapes of the conductive films 120M1 and 120M2 may be easily restricted by a layout of the TFT 22 and other wiring layer. Moreover, a degree of flexibility in setting a film thickness is low, because the gate insulating film (the first gate insulating film 121 and the second gate insulating film 123) of the TFT 22 is used.

Therefore, when the definition of the pixel P becomes higher and the size of the pixel P becomes smaller, it is difficult to secure a sufficient capacity by the capacitive elements 21B and 21C alone. As a result, a charge amount of the pixel P may be saturated before irradiation of an X-ray quantity necessary for image acquisition. In this situation, providing the above-described capacitive element 21A makes it possible to expand the capacity. The layers higher than the drive substrate 12 are less easily restricted by the layout than the inside of the drive substrate 12 is. Therefore, it is possible to form the conductive film 25 facing the entire region of the charge collection electrode 18, so that a large formation region may be secured for the conductive film 25. In addition, due to a high degree of flexibility in setting the film thickness of the insulating film 127, it is easy to secure a desirable retention capacitor in the capacitive element 21A.

As described above, in the present embodiment, between the drive substrate 12 and the charge collection electrode 18, the conductive film 25 is provided to face the entire region of the charge collection electrode 18, so that the capacitive element 21A that retains the signal charge is configured. Therefore, in the capacitive element 21A, a degree of flexibility in layout design is high, and it is easy to secure a retention capacitor. Hence, it is possible to suppress a reduction in electric charge saturation (a dynamic range or a maximum charge retention quantity) by securing a desirable capacity, even when a pixel size becomes small. Accordingly, it is possible to suppress image quality deterioration accompanying an increase in pixel definition.

Next, a modification of the above-described embodiment will be described. It is to be noted that the same components as those of the above-described embodiment will be provided with the same reference numerals as those thereof, and the description of these components will be omitted as appropriate.

[Modification 1]

Figure 9:
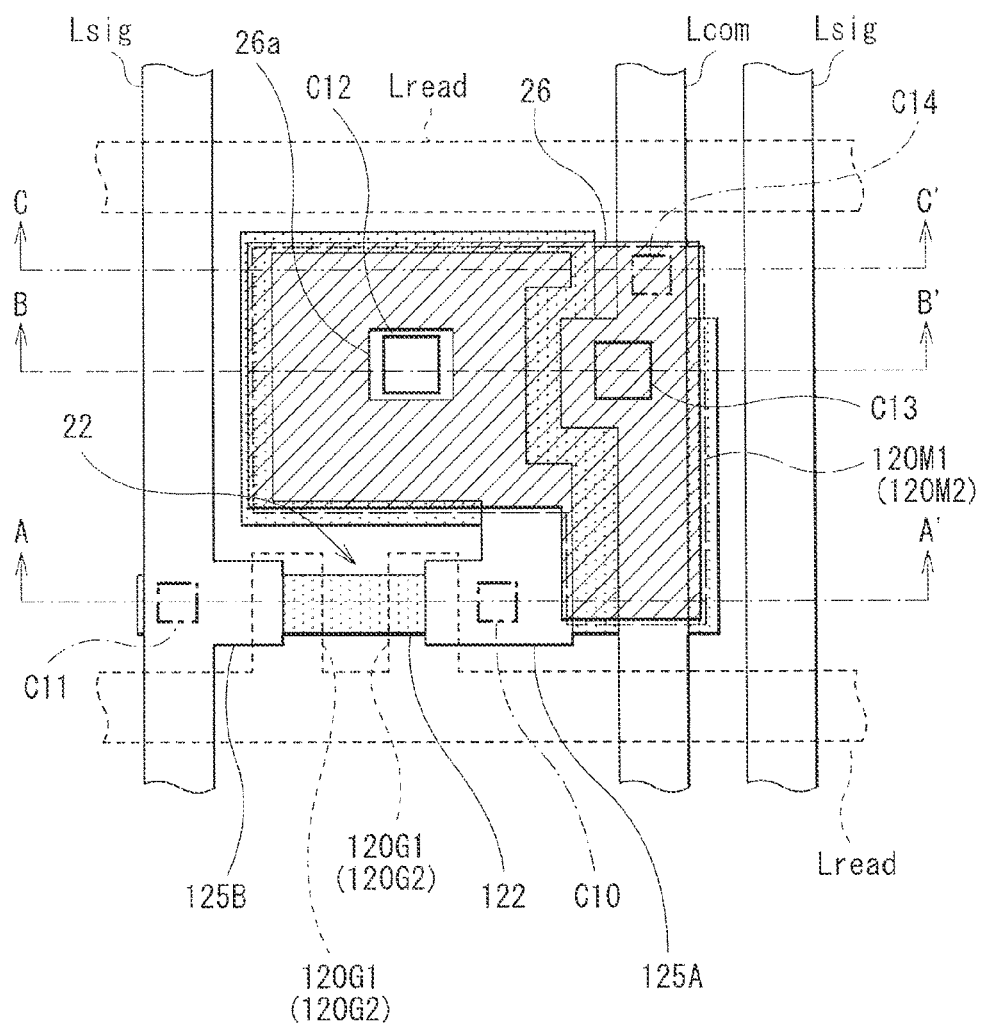
FIG. 9 is a plan view illustrating a main part configuration of a part in the vicinity of a pixel according to Modification 1.
Figure 10:
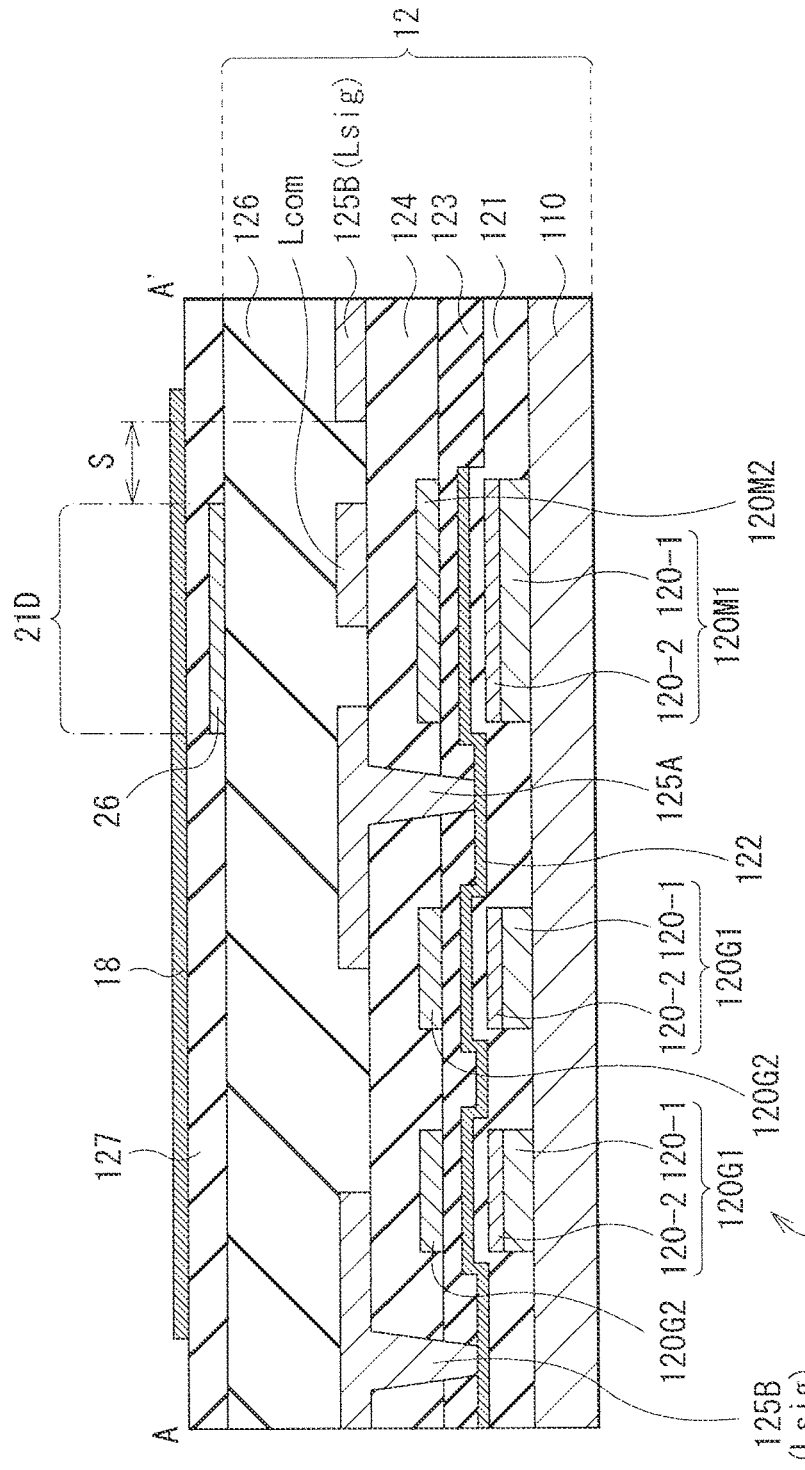
FIG. 10 is a cross-sectional diagram taken along a line A-A' of the part in the vicinity of the pixel illustrated in FIG. 9.
Figure 11:
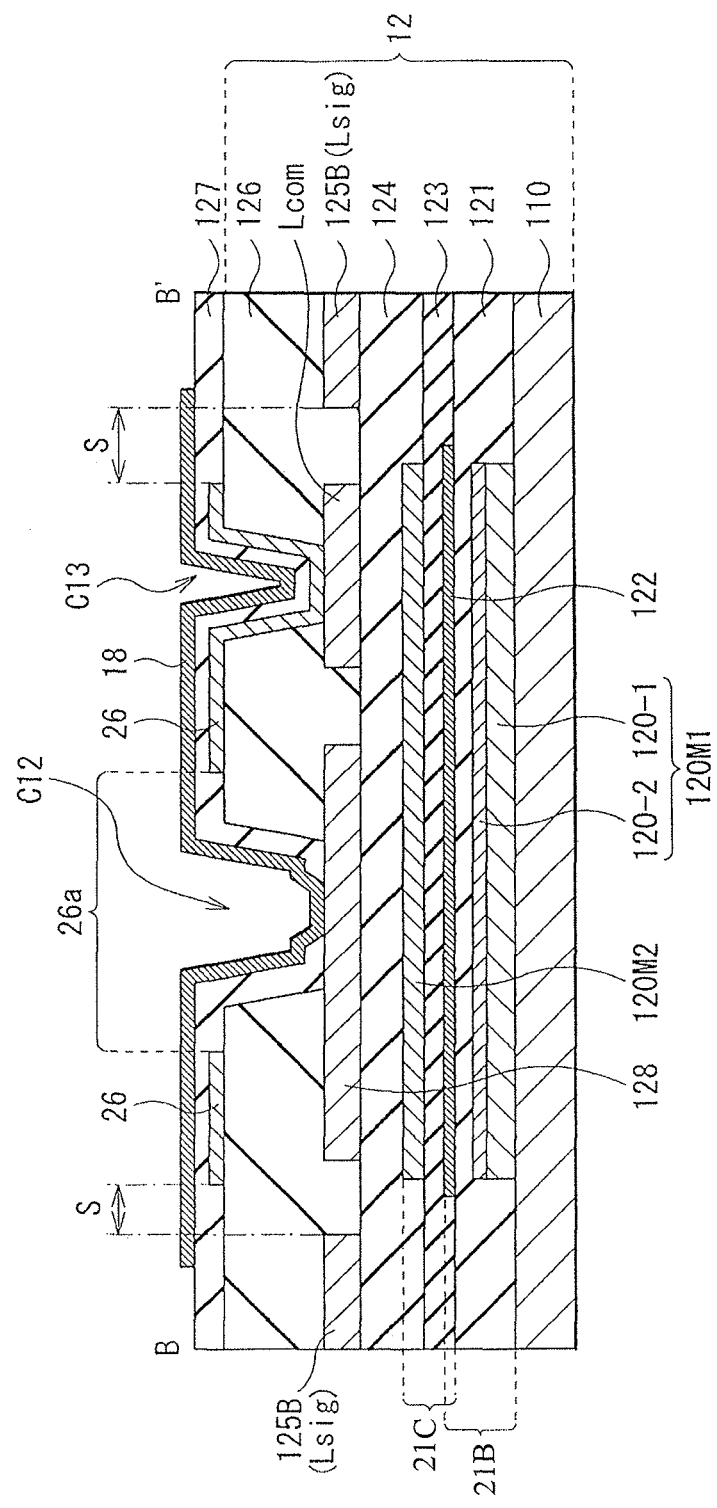
FIG. 11 is a cross-sectional diagram taken along a line B-B' of the part in the vicinity of the pixel illustrated in FIG. 9.
Figure 12:
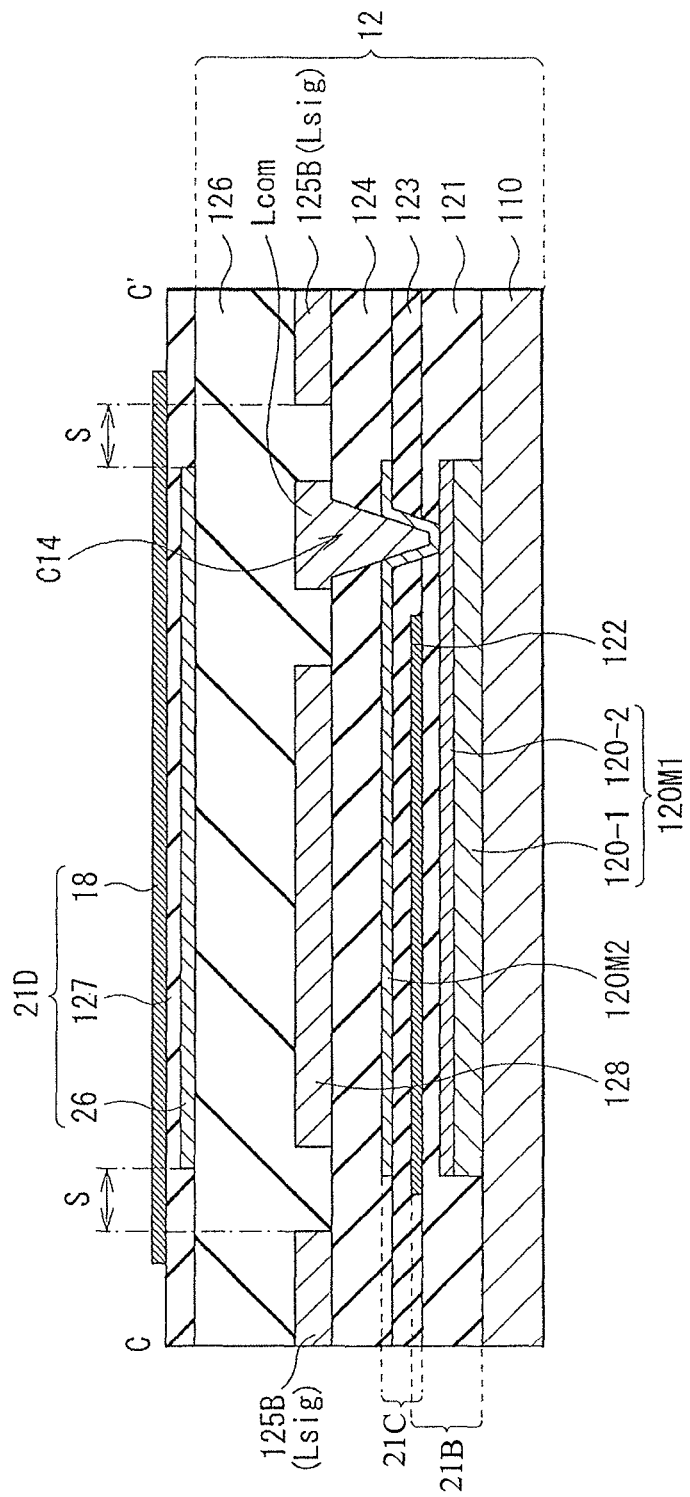
FIG. 12 is a cross-sectional diagram taken along a line C-C' of the part in the vicinity of the pixel illustrated in FIG. 9.

FIG. 9 is a plan view illustrating a main part configuration of a part in the vicinity of the pixel P according to Modification 1. Further, FIG. 10 illustrates a cross-sectional configuration taken along a line A-A' of FIG. 9, FIG. 11 illustrates a cross-sectional configuration taken along a line B-B' of FIG. 9, and FIG. 12 illustrates a cross-sectional configuration taken along a line C-C' of FIG. 9. In the present modification, a configuration of the drive substrate 12 including the TFT 22 as well as the capacitive elements 21B and 21C is similar to that of the above-described embodiment. However, in the present modification, a configuration of a conductive film (a conductive film 26) provided between the drive substrate 12 and the charge collection electrode 18 is different from that of the above-described embodiment.

Specifically, in the present modification, the conductive film 26 is provided to face only a part of the charge collection electrode 18, so that the capacitive element 21D is configured. For example, the conductive film 26 may not face the TFT 22, the signal line Lsig, and the readout control line Lread, and may have a predetermined space S with respect to (may be provided to be separated from) each of the signal line Lsig and the readout control line Lread (FIGS. 9 to 12). The size of the space S is not limited in particular, but may be, for example, 2 μm or more. Further, the space S is formed in a region except an electrode formation region of the TFT 22 (FIG. 9). It is to be noted that the charge collection electrode 18 may be preferably formed to cover the pixel opening, from the viewpoint of sensitivity and a fill factor, as with the above-described embodiment. The conductive film 26 is configured of a material similar to that of the conductive film 25 of the above-described embodiment, and has a contact opening 26a in a region corresponding to the contact section C12 (FIGS. 9 and 11). Further, the conductive film 26 is connected to the common ground line Lcom, through the contact section C13 (FIGS. 9 and 11).

In this way, between the drive substrate 12 and the charge collection electrode 18, the conductive film 26 may be provided to face only a part of the charge collection electrode 18. In this case as well, it is possible to obtain effects equivalent to those of the above-described embodiment. In addition, the conductive film 26 has the space S with respect to the TFT 22, the signal line Lsig, and the readout control line Lread and therefore, it is possible to suppress an increase in parasitic capacitance with respect to each thereof. Hence, an influence of noise is reduced so that an improvement in image quality is allowed.

Application Example

The radiation image-pickup device 1 according to any of the above-described embodiment and the like is applicable to a radiation image-pickup display system, as will be described below.

Figure 13:
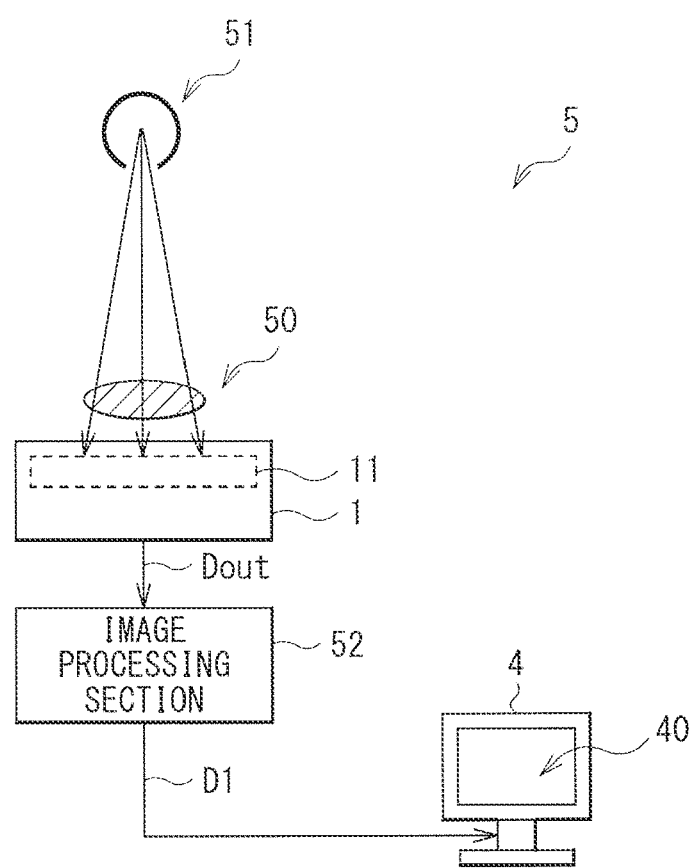
FIG. 13 is a schematic diagram illustrating a schematic configuration of a radiation image-pickup display system according to an application example.

FIG. 13 schematically illustrates a schematic configuration example of a radiation image-pickup display system (a radiation image-pickup display system 5) according to an application example. The radiation image-pickup display system 5 includes the radiation image-pickup device 1, an image processing section 52, and a display 4. The radiation image-pickup device 1 includes the pixel section 11 and the like according to any of the above-described embodiment and the like.

The image processing section 52 generates image data D1, by performing predetermined image processing on the output data Dout (the image pickup signal) outputted from the radiation image-pickup device 1. Based on the image data D1 generated in the image processing section 52, the display 4 displays an image on a predetermined monitor screen 40.

In the radiation image-pickup display system 5, based on radiation emitted towards a subject 50 from a radiation source 51 such as an X-ray source, the radiation image-pickup device 1 obtains image data Dout of the subject 50, and outputs the obtained image data Dout to the image processing section 52. The image processing section 52 performs the above-described predetermined image processing on the inputted image data Dout, and outputs the image data (display data) D1 after the image processing, to the display 4. The display 4 displays image information (a picked-up image) on the monitor screen 40 based on the inputted image data D1.

In this way, in the radiation image-pickup display system 5 of the present application example, the radiation image-pickup device 1 is allowed to obtain an image of the subject 50 as an electric signal. Therefore, it is possible to display the image by transmitting the obtained electric signal to the display 4. In other words, it is possible to observe an image of the subject 50 without using a radiographic film. In addition, it is also possible to support moving-image taking and moving-image display.

The embodiment, modification, and application example have been described above, but the contents of the present disclosure are not limited thereto, and may be variously modified. For example, the circuit configuration of the pixel in the pixel section of each of the above-described embodiment and the like is not limited to those (the configuration of the passive pixel circuit 20) described above, and may be other circuit configuration (for example, an active-matrix pixel circuit configuration). Similarly, the circuit configuration of each of other components such as the row scanning section and the column selection section is not limited to those of the above-described embodiment and the like, and may be other circuit configuration.

Further, the pixel section, the row scanning section, the A/D conversion section (the column selection section), the column scanning section, and the like of each of the above-described embodiment and the like may be formed, for example, on the same substrate. Specifically, for example, using a polycrystalline semiconductor such as low temperature poly-silicon, the switch and the like in these circuit portions may be formed on the same substrate. Therefore, for example, driving operation on the same substrate may be performed based on a control signal from an external system control section, which allows achievement of a slim bezel (a frame structure in which three sides are free) and an improvement in reliability in wiring connection.

Further, any combinations of the configurations, methods, processes, shapes, materials, and numerical values described above in the embodiments are allowed without deviating from the spirit of the present disclosure.

It is possible to achieve at least the following configurations from the above-described example embodiments of the disclosure.

(1) A radiation image-pickup device including:
   a drive substrate including a transistor used to read, from each of a plurality of pixels, signal charge based on radiation;
   a charge collection electrode provided on the drive substrate, for each of the pixels;
   a conversion layer formed on the charge collection electrode, and configured to generate the signal charge by absorbing radiation;
   a counter electrode provided on the conversion layer; and
   a first conductive film disposed, between the drive substrate and the charge collection electrode, to face at least a part of the charge collection electrode, and included in a first capacitive element configured to retain the signal charge.

(2) The radiation image-pickup device according to (1), wherein
   the charge collection electrode is formed over an entire region of a pixel opening, for each of the pixels, and
   the first conductive film is formed to face an entire region of the charge collection electrode.

(3) The radiation image-pickup device according to (1), wherein
   the charge collection electrode is formed over an entire region of a pixel opening, for each of the pixels, and
   the first conductive film is formed to face a part of the charge collection electrode.

(4) The radiation image-pickup device according to (3), wherein
   the transistor is connected to a readout control line and a signal line, and
   the first conductive film is provided to be separated from the readout control line and the signal line, in an in-plane direction of the drive substrate.

(5) The radiation image-pickup device according to (4), wherein the first conductive film is a provided in a region except an electrode formation region of the transistor.

(6) The radiation image-pickup device according to any one of (1) to (5), wherein the first conductive film is configured using a transparent conductive film.

(7) The radiation image-pickup device according to any one of (1) to (6), wherein, in the drive substrate, other capacitive element retaining the signal charge is formed in a same layer as the transistor.

(8) The radiation image-pickup device according to (7), wherein
   the transistor includes
   a semiconductor layer configured using poly-silicon,
   a first gate electrode and a second gate electrode disposed to face each other, with the semiconductor layer interposed therebetween,
   a first gate insulating film and a second gate insulating film, the first gate insulating film being formed between the semiconductor layer and the first gate electrode, and the second gate insulating film being formed between the semiconductor layer and the second gate electrode, and a source electrode and a drain electrode electrically connected to the semiconductor layer, and
the other capacitive element includes
a second capacitive element including a second conductive film, the semiconductor layer, and the first gate insulating film, the second conductive film being formed in a same layer as the first gate electrode, and
a third capacitive element including a third conductive film, the semiconductor layer, and the second gate insulating film, the third conductive film being formed in a same layer as the second gate electrode.

(9) The radiation image-pickup device according to any one of (1) to (8), wherein the radiation includes X-rays.

(10) The radiation image-pickup device according to any one of (1) to (9), further including a flattening film on a surface of the drive substrate,
wherein the first conductive film is provided on the flattening film.

(11) A radiation image-pickup display system including:
a radiation image-pickup device; and
a display configured to perform image display based on an image pickup signal obtained by the radiation image-pickup device,
wherein the radiation image-pickup device includes
a drive substrate including a transistor used to read, from each of a plurality of pixels, signal charge based on radiation,
a charge collection electrode provided on the drive substrate, for each of the pixels,
a conversion layer formed on the charge collection electrode, and configured to generate the signal charge by absorbing radiation,
a counter electrode provided on the conversion layer, and
a first conductive film disposed, between the drive substrate and the charge collection electrode, to face at least a part of the charge collection electrode, and included in a first capacitive element configured to retain the signal charge.

It should be understood by those skilled in the art that various modifications, combinations, sub-combinations, and alterations may occur depending on design requirements and other factors insofar as they are within the scope of the appended claims or the equivalents thereof.

What is claimed is:

1. A radiation image-pickup device comprising:
a drive substrate including a transistor used to read, from each of a plurality of pixels, signal charge based on radiation;
a charge collection electrode provided on the drive substrate, for each of the pixels;
a conversion layer formed on the charge collection electrode, and configured to generate the signal charge by absorbing radiation;
a counter electrode provided on the conversion layer; and
a first conductive film disposed between the drive substrate and the charge collection electrode, disposed to face at least a part of the charge collection electrode, and included in a first capacitive element configured to retain the signal charge, wherein the transistor includes
a semiconductor layer configured using poly-silicon,
a first gate electrode and a second gate electrode disposed to face each other, with the semiconductor layer interposed therebetween,
a first gate insulating film and a second gate insulating film, the first gate insulating film being formed between the semiconductor layer and the first gate electrode, and the second gate insulating film being formed between the semiconductor layer and the second gate electrode, and
a source electrode and a drain electrode electrically connected to the semiconductor layer, and
another capacitive element configured to retain the signal charge is formed in a same layer as the transistor, the other capacitive element including
a second capacitive element including a second conductive film, the semiconductor layer, and the first gate insulating film, the second conductive film being formed in a same layer as the first gate electrode, and
a third capacitive element including a third conductive film, the semiconductor layer, and the second gate insulating film, the third conductive film being formed in a same layer as the second gate electrode.

2. The radiation image-pickup device according to claim 1, wherein
the charge collection electrode is formed over an entire region of a pixel opening, for each of the pixels, and
the first conductive film is formed to face an entire region of the charge collection electrode.

3. The radiation image-pickup device according to claim 1, wherein
the charge collection electrode is formed over an entire region of a pixel opening, for each of the pixels, and
the first conductive film is formed to face a part of the charge collection electrode.

4. The radiation image-pickup device according to claim 3, wherein
the transistor is connected to a readout control line and a signal line, and
the first conductive film is provided to be separated from the readout control line and the signal line, in an in-plane direction of the drive substrate.

5. The radiation image-pickup device according to claim 4, wherein the first conductive film is a provided in a region except an electrode formation region of the transistor.

6. The radiation image-pickup device according to claim 1, wherein the first conductive film is configured using a transparent conductive film.

7. The radiation image-pickup device according to claim 1, wherein the radiation includes X-rays.

8. The radiation image-pickup device according to claim 1, further comprising a flattening film on a surface of the drive substrate,
wherein the first conductive film is provided on the flattening film.

9. A radiation image-pickup display system comprising:
a radiation image-pickup device; and
a display configured to perform image display based on an image pickup signal obtained by the radiation image-pickup device,
wherein the radiation image-pickup device includes
a drive substrate including a transistor used to read, from each of a plurality of pixels, signal charge based on radiation,
a charge collection electrode provided on the drive substrate, for each of the pixels,
a conversion layer formed on the charge collection electrode, and configured to generate the signal charge by absorbing radiation,
a counter electrode provided on the conversion layer, and
a first conductive film disposed between the drive substrate and the charge collection electrode, disposed to face at least a part of the charge collection electrode, and included in a first capacitive element configured to retain the signal charge, wherein the transistor includes a semiconductor layer configured using poly-silicon, a first gate electrode and a second gate electrode disposed to face each other, with the semiconductor layer interposed therebetween, a first gate insulating film and a second gate insulating film, the first gate insulating film being formed between the semiconductor layer and the first gate electrode, and the second gate insulating film being formed between the semiconductor layer and the second gate electrode, and a source electrode and a drain electrode electrically connected to the semiconductor layer, and another capacitive element configured to retain the signal charge is formed in a same layer as the transistor, the other capacitive element including a second capacitive element including a second conductive film, the semiconductor layer, and the first gate insulating film, the second conductive film being formed in a same layer as the first gate electrode, and a third capacitive element including a third conductive film, the semiconductor layer, and the second gate insulating film, the third conductive film being formed in a same layer as the second gate electrode.

* * * * *